United States Patent
Rathore et al.

(10) Patent No.: US 6,258,710 B1
(45) Date of Patent: *Jul. 10, 2001

(54) SUB-QUARTER-MICRON COPPER INTERCONNECTIONS WITH IMPROVED ELECTROMIGRATION RESISTANCE AND REDUCED DEFECT SENSITIVITY

(75) Inventors: Hazara S. Rathore, Stormville; Hormazdyar M. Dalal, Milton; Paul S. McLaughlin, Poughkeepsie, all of NY (US); Du B. Nguyen, Danbury, CT (US); Richard G. Smith, Poughkeepsie, NY (US); Alexander J. Swinton, Hopewell Junction, NY (US); Richard A. Wachnik, Brewster, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 09/459,167

(22) Filed: Dec. 10, 1999

Related U.S. Application Data

(63) Continuation of application No. 08/947,277, filed on Oct. 8, 1997, now Pat. No. 6,069,068, which is a continuation-in-part of application No. 08/866,777, filed on May 30, 1997, now Pat. No. 6,130,161.

(51) Int. Cl.⁷ .............................................. H01L 21/4763

(52) U.S. Cl. .......................... 438/628; 438/654; 438/658; 438/660; 438/687; 427/99; 427/123; 427/124

(58) Field of Search .......................... 427/99, 123, 124; 438/687, 652, 654, 622, 624, 628, 629, 637, 638, 644, 658, 660, 666

(56) References Cited

U.S. PATENT DOCUMENTS

| | | |
|---|---|---|
| 4,007,039 | 2/1977 | Shapiro et al. . |
| 4,017,890 | 4/1977 | Howard et al. . |
| 4,153,518 | 5/1979 | Holmes et al. . |
| 4,154,874 | 5/1979 | Howard et al. . |
| 4,379,832 | 4/1983 | Dalal et al. . |
| 4,406,858 | 9/1983 | Woodford et al. . |
| 4,789,648 | 12/1988 | Chow et al. . |
| 4,872,048 | 10/1989 | Akutsu et al. . |
| 4,985,750 | 1/1991 | Hoshino . |
| 5,187,300 | 2/1993 | Norman . |
| 5,231,751 | 8/1993 | Sachdev et al. . |
| 5,250,329 | 10/1993 | Miracky et al. . |
| 5,252,516 | 10/1993 | Nguyen et al. . |

(List continued on next page.)

FOREIGN PATENT DOCUMENTS

| | | |
|---|---|---|
| 3-244126 | 10/1991 | (JP) . |
| 9-69522 | 3/1997 | (JP) . |

OTHER PUBLICATIONS

IBM Technical Disclosure Bulletin, vol. 30, No. 12, May 1988 Optimum Metal Line Structures for Memory Array and Support Circuits pp. 170–171.

VLSI Multilevel Interconnection Conference (VMIC), Jun. 8–9, 1993 Planar Copper–Polymide Back End of the Line Interconnections for ULSI Devices pp. 15–21.

Primary Examiner—Shrive Beck
Assistant Examiner—Jennifer Calcagni
(74) Attorney, Agent, or Firm—DeLio & Peterson, LLC; John J. Tomaszewski; Aziz M. Ahsan

(57) ABSTRACT

A method of providing sub-half-micron copper interconnections with improved electromigration and corrosion resistance. The method includes double damascene using electroplated copper, where the seed layer is deposited by chemical vapor deposition, or by physical vapor deposition in a layer less than about 800 angstroms.

9 Claims, 10 Drawing Sheets

U.S. PATENT DOCUMENTS

| | | |
|---|---|---|
| 5,256,565 | 10/1993 | Bernhardt et al. . |
| 5,266,446 | 11/1993 | Chang et al. . |
| 5,273,775 | 12/1993 | Dyer et al. . |
| 5,300,813 | 4/1994 | Joshi et al. . |
| 5,312,509 | 5/1994 | Eschbach . |
| 5,322,712 | 6/1994 | Norman et al. . |
| 5,380,546 | 1/1995 | Krishnan et al. . |
| 5,391,517 | 2/1995 | Gelatos et al. . |
| 5,403,779 | 4/1995 | Joshi et al. . |
| 5,414,301 | 5/1995 | Thomas . |
| 5,426,330 | 6/1995 | Joshi et al. . |
| 5,434,451 | 7/1995 | Dalal et al. . |
| 5,565,707 | 10/1996 | Colgan et al. . |
| 5,814,557 | 9/1998 | Venkatraman et al. . |
| 5,821,168 | 10/1998 | Jain . |
| 5,850,102 | 12/1998 | Matsuno . |
| 5,897,375 | 4/1999 | Watts et al. . |
| 6,069,068 * | 5/2000 | Rathore et al. ..................... 438/628 |
| 6,074,499 * | 6/2000 | Stone et al. ......................... 148/433 |
| 6,130,161 | 10/2000 | Ashley et al. . |

* cited by examiner

SUB-QUARTER-MICRON COPPER INTERCONNECTIONS WITH IMPROVED ELECTROMIGRATION RESISTANCE AND REDUCED DEFECT SENSITIVITY

This is a continuation Ser. No. 08/947,277 filed on Oct. 8, 1997, now U.S. Pat. No. 6,069,068.

BACKGROUND OF THE INVENTION

This patent application is a Continuation-In-Part of U.S. patent application Ser. No. 08/866,777 entitled "COPPER INTERCONNECTIONS WITH ENHANCED ELECTROMIGRATION RESISTANCE AND REDUCED DEFECT SENSITIVITY AND METHOD OF FORMING SAME" filed May 30, 1997, now U.S. Pat. No. 6,130,161.

1. Field of the Invention

The present invention relates to the field of semiconductor manufacturing and, more specifically, to the design of copper based interconnections in sub-micron dimensions with reduced sensitivity for corrosion and defects, and thereby, with improved reliability. The invention also relates to providing methods for forming the designed structure.

2. Description of Related Art

As device geometry continues to scale down for Ultra Large Scale Integrated circuits, there is a growing demand for an interconnect wiring with minimum pitch and high conductivity, and, for a passivation material with a low dielectric constant, while requiring a more robust reliability than ever before. In particular, in the regime of sub-quarter micron line width, the factors of paramount importance are high electrical conductivity and high electromigration resistance.

One approach has been to use copper metallurgy, for its high conductivity and high electromigration resistance, along with polyimide passivation for low cross capacitance. A process utilizing this approach is disclosed by Luther et al. in VLSI Multilevel Interconnection Conference (VMIC), pp.15–21, 1993. Further process improvement, using a double damascene method to simultaneously form copper interconnection lines and inter-level via-studs, is taught by Dalal et al. in U.S. Pat. No. 5,434,451, of common assignee with the present application. Damascene methods involve filling of narrow trenches or narrow holes or a combination of both. It is well known in the art that the use of Physical Vapor Deposition (PVD) methods such as sputtering or evaporation to fill such narrow holes and trenches is not suitable because a highly tapered cross section of the filled metal lines or studs is formed. Joshi et al. in U.S. Pat. No. 5,300,813, also of common assignee with the present application, teaches using PVD methods to deposit the high conductivity metal followed by Chemical Vapor Deposition (CVD) of a tungsten cap layer to fill up the top part of the tapered cross section. This capping process results in substantial reduction in cross-sectional area of copper conductor because of the tapered cross-section. Also, because the capping metal is deposited along with the conductor metal, slits of conductor metal are exposed along the conductor edges in the finished product. Further, during the chemical-mechanical polishing step in this capping process, the hard metal particles removed by polishing tend to abrade the metal line. Therefore, conformal deposition methods such as CVD or electroplating are required for copper deposition.

However, it has been found that CVD copper suffers from limited shelf life of the highly complex precursors required. A more serious problem with CVD copper is the contamination of manufacturing line by vapors of copper precursor, which poison the semiconductor devices.

Copper deposition by electroplating has been in use for Printed Circuit Board (PCB) for decades. Because of its low cost, low deposition temperature and its ability to conformally coat narrow openings, electroplating is a preferred method of deposition in copper interconnections. It should be understood that electroplating of copper requires a copper seed layer on the substrate. Invariably, a PVD method has been used to deposit copper for seed layer. However, it has been found that PVD deposited copper has ten times lower electromigration resistance, as compared to electroplated copper; and three times lower electromigration resistance, as compared to CVD copper. Because the copper seed layer may form up to 20% of the cross-sectional area of an interconnect line, this seed layer seriously hampers the electromigration characteristic of copper interconnection. Whereas the electromigration resistance of copper is high enough to sustain the wear-out in normally designed conductor lines, defect-induced electromigration failures have been observed in the PVD seed layer/electroplated copper conductor lines. Because of the high conductivity of copper, line defects such as conductor line width or thickness, when thinned down to a couple of hundred angstroms, are able to pass undetected through the electrical screen tests. Understandably, current density in these regions is considerably high during actual use, thereby causing early field fails due to electromigration.

Another major problem in using a PVD method for seed layer arises when interconnection lines are of sub-quarter-micron dimensions. Here, even a thin seed layer deposited by PVD technique, considerably narrows down the opening as mentioned above. This results in a hollow shelled line.

CVD copper deposition techniques present problems, for example, contamination of the manufacturing line by vapors of copper precursor, thereby poisoning the semiconductor devices. The greater the thickness of CVD deposited copper, the greater is the propensity for line contamination.

Co-deposition of various elements with copper for high temperature application or for improving the mechanical strength is taught by Thomas in U.S. Pat. No. 5,414,301; by Shapiro et al. in U.S. Pat. No. 4,007,039; Akutsu et al. in U.S. Pat. No. 4,872,048; and, by Woodford and Bricknell in U.S. Pat. No. 4,406,858. However, when copper is co-deposited with another element, the electrical resistivity usually increases, which defies the very purpose of using copper in high performance systems.

Yet another reliability concern in copper metallurgy is corrosion. This is described below with the help of illustrations in FIGS. 1 and 1a. FIG. 1 is part of a structure of the above described interconnect scheme of the prior art, showing two levels of metal interconnections, each level defined by a double damascene method. FIG. 1a is an enlarged view of cross-section of an interconnect; wherein, copper interconnect line 9 on one level is shown making contact to lower level metal interconnect line 102 through via-stud 11. It should be understood that in a double damascene method the via stud 11 and the conductor line 102 are an integral part of one another. The copper interconnect comprises an adhesive layer 5, an optional barrier layer 6; a PVD copper seed layer 8; bulk copper layer 9 and 11, and an inorganic insulator 4 atop polyimide insulator 3.

It has been found that corrosion of copper lines generally takes place in association with the use of polyimide for interlevel insulation. This is because whenever polyimide is used for interlevel insulation its application usually involves addition of a thin layer of inorganic insulator 4. This thin layer of inorganic insulator is added either to act as an etch stop, as taught in U.S. Pat. No. 4,789,648 to Chow et al., or to reduce polyimide debris formation during chemical-mechanical polishing, as taught by Joshi et al. in U.S. Pat. No. 5,403,779 (both patents assigned to the instant assignee). The deleterious effect of this inorganic insulator layer 4 is that it prevents escape of the residual moisture in the polyimide film. Consequently, vapor pressure builds up in polyimide film, which finds a path to the copper. As a result, copper oxides and hydroxides are formed. With time and temperature, these oxides and hydroxides ultimately result in formation of voids 13 (FIG. 1) in the copper conductor. These corrosion induced voids 13 are believed to initiate from the top surface of the copper conductor for two reasons. One, liner layers 5 and 6 cover the bottom and sides of the conductor lines, but not the top surface. Second, junctions between the inorganic insulator layer 4 and the liner 5 and 6 on the conductor line side walls become disjointed during process temperature excursions, thereby providing a path for moisture to come in contact with copper. Joshi et al. U.S. Pat. No. 5,426,330, assigned to the instant assignee, teaches a method of providing a tungsten cap atop the copper conductor to prevent copper corrosion. As discussed earlier, this capping method forms undesirable metal debris during polishing, causing metal line abrasion.

Thus, despite repeated efforts, and various schemes in the prior art, manufacturing problems due to defect sensitive electromigration failure and corrosion remain. Better methods for making copper integrated circuit pattern with improved reliability and reduced defect sensitivity need to be developed.

Bearing in mind the problems and deficiencies of the prior art, it is therefore an object of the present invention to provide a method for fabricating high performance interconnection circuitry of sub-half-micron dimension with improved process yield and reliability.

Another object of the present invention is to provide a high conductivity copper based metallurgy with low dielectric constant polyimide passivation.

It is yet another object of the present invention to reduce defect sensitivity of copper interconnect metallurgy by improving its electromigration resistance.

It is still another objective of the present invention to provide electroplated copper interconnection lines with reduced PVD copper seed layer thickness to improve the electromigration resistance of the interconnect line.

It is a further object of the present invention to provide a method of metal capping copper lines which does not affect the metal line integrity.

SUMMARY OF THE INVENTION

The above and other objects, which will be apparent to those skilled in the art, are achieved in the present invention which relates to a method of providing in substrates sub-half-micron copper interconnections with improved electromigration and corrosion resistance. The method may include a double damascene method using electroplated copper, where a reduced thickness PVD layer is employed, or where the PVD layer is replaced by a contormal coating of CVD copper seed layer which has about three times higher electromigration resistance than that for the PVD deposited copper. In the present invention the seed layer may also be converted to an intermetallic layer. A layer of a copper intermetallic such as hafnium, lanthanum, zirconium, tin and titanium is provided to improve the electromigration resistance and to reduce defect sensitivity. A method is also provided to form a cap which fully covers the surface on top of copper lines formed in the substrate to improve corrosion resistance. Structure and methods are also described to improve the electromigration and corrosion resistance by incorporating carbon atoms in copper interstitial positions.

In one aspect, the present invention comprises a method for forming multilevel interconnections of copper lines isolated from one another by dielectric insulation for making contacts to electrical features in a substrate. The method comprising the steps of first preparing a substrate having a dielectric insulation layer to receive copper lines in a defined pattern and optionally depositing a metallic liner in the pattern. Subsequently there is deposited in the pattern a layer of a reduced thickness PVD copper, a layer of CVD copper, or a layer of an element capable of forming an intermetallic compound with copper, followed by one or more layers of copper. In the case where an intermetallic-forming element is deposited, the substrate is then heated to react the intermetallic forming element with the copper layer to form a layer of intermetallic compound in the copper layer. The intermetallic forming element is preferably selected from the group consisting of hafnium, lanthanum, titanium, tin and zirconium. The intermetallic forming element layer may be deposited before the copper layer or a copper layer is deposited before the intermetallic forming element layer. Also, the intermetallic forming element layer may be deposited before the copper layer, and a further intermetallic forming element layer may be deposited after the copper layer.

The metallic liner, the layer of intermetallic forming element and the layer of copper may be deposited by common or separate deposition techniques selected from the group consisting of sputtering, evaporation and CVD. Preferably, the metallic liner, the layer of intermetallic forming element and the layer of copper are in-situ deposited by sputtering in a single pump down, wherein the sputtering may be reactive sputtering, collimated sputtering, magnetron sputtering, low pressure sputtering, ECR sputtering, ionized beam sputtering and any combination thereof.

In a more preferred method, the present invention relates to a method of forming reliable multilevel interconnections of copper lines, at sub-micron pitch and isolated from one another by low dielectric insulation to make contacts to electrical features in a substrate. The method comprising the steps of initially depositing a pair of insulation layers on a substrate having an electrical feature, photolithographically defining a via-studs pattern on at least one of the insulation layers, partially etching the pair of insulation layers, photolithographically defining an interconnection line pattern on at least one of the insulation layers, and etching the insulation layers until the electrical feature is exposed; thereby, forming trenches and holes in the pair of insulators. Subsequently, there is deposited a liner metallurgy in the trenches and holes. A layer of an element capable of forming an intermetallic compound with copper is deposited, as well as one or more layers of copper to fill the holes and trenches. The copper is polished to remove excess metal outside of the trenches and the substrate is heated to react the intermetallic forming element with copper to form a layer of an intermetallic compound with copper.

One of the copper layers may be deposited by reactive sputtering of copper with a carbonaceous gas to incorporate carbon atoms within the lattice of deposited copper. Preferably, the thickness of the intermetallic forming element is between about 100 angstroms and 600 angstroms. The intermetallic layer may be formed beneath copper in the holes and trenches, within copper in the holes and trenches, or above copper in the holes and trenches.

In a related aspect, the present invention provides a substrate having interconnections of copper lines comprising a pair of insulation layers disposed on a substrate having an electrical feature, the insulation layers having etched via-stud patterns and etched interconnection line patterns forming holes and trenches in the pair of insulators. A metallic layer lines the trenches and holes, and copper fills the holes and trenches, with a portion of the copper including therein a region of a copper intermetallic compound.

In another aspect, the present invention relates to a method of providing copper interconnections having improved electromigration and corrosion resistance on a substrate having trenches comprising the steps of heating the substrate in a vacuum tool, introducing a carbonaceous material, in gaseous form, into the vacuum, and depositing copper metal in the substrate trenches while simultaneously incorporating interstitial atoms into the copper lattice to form copper lines in the trenches. Preferably, the substrate is held at a temperature between 100–400° C. during the deposition and the carbonaceous material is a hydrocarbon having the formula $C_xH_y$ or $C_xH_x$ and containing no oxygen, nitrogen or sulphur.

In a related aspect, the invention provides a substrate having interconnections of copper lines comprising a pair of insulation layers disposed on a substrate having an electrical feature, the insulation layers having etched via-stud patterns and etched interconnection line patterns forming holes and trenches in the pair of insulators, a metallic layer lining the trenches and holes, and copper filling the holes and trenches, the copper containing from about 0.1 to 15 ppm carbon.

In a further aspect, the invention relates to a method of providing a protective cap on a substrate interconnection having a surface planar with surrounding insulation. The method comprises the steps of providing a substrate having an insulative layer thereon, etched via-stud patterns and etched interconnection line patterns forming holes and trenches within the insulative layer, and copper metallurgy filling the holes and trenches to an upper surface of the insulative layer to form a substrate interconnection. Then the copper is polished to recess its surface below the surrounding insulative layer surface. There is subsequently deposited a layer of a material for a cap over the recessed copper to a level above the surrounding insulative layer surface. The substrate is then polished to remove the cap material from regions outside of the substrate interconnection and form a cap surface planar with the surrounding insulative layer surface. Preferably, the recess thickness is about 100 angstroms to 400 angstroms, and the material for the cap is selectively deposited and chosen from the group consisting of tungsten, tungsten-silicon, tungsten-nitrogen, hafnium, zirconium, tantalum, tantalum-nitride, titanium, tin, lanthanum, germanium, carbon, chromium, chromium-chromium oxide, tin, platinum, and, combinations thereof.

In yet another aspect, the present invention provides a method for forming multilevel interconnections of copper lines isolated from one another by dielectric insulation for making contacts to electrical features in a substrate, the method comprising the steps of:

(a) preparing a substrate having a dielectric insulation layer to receive copper lines in a defined pattern;
(b) optionally depositing a metallic liner in the pattern;
(c) subsequently depositing in the pattern either a chemical vapor deposition layer of copper or a physical vapor deposition layer of copper having a thickness of less than about 800 angstroms; and
(d) depositing over the chemical or physical vapor deposition copper layer, by a different process, a layer of copper to substantially fill the pattern.

The chemical vapor deposition copper layer may preferably have a thickness of about 50 to 2000 angstroms, more preferably about 100 to 700 angstroms. The physical vapor deposition may be by copper sputtering or by copper evaporation, and preferably the physical vapor deposition copper layer has a thickness below about 600 angstroms.

Prior to depositing the chemical or physical vapor deposition copper layer, the method may include the step of depositing in the pattern a layer of an element capable of forming an intermetallic compound with copper. Subsequent to depositing the layer of copper which substantially fills the pattern, the invention may include the step of heating the substrate to react the intermetallic forming element with the layer of copper which substantially fills the pattern to form a layer of intermetallic compound.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIGS. 5a and 5b are elevational views of an alternate embodiment of the invention where the intermetallic layer is formed in the middle of the copper interconnection wherein FIG. 5a shows a small dimension via-stud and FIG. 5b shows a large dimension via-stud.

DESCRIPTION OF THE PREFERRED EMBODIMENT(S)

Figure 1:
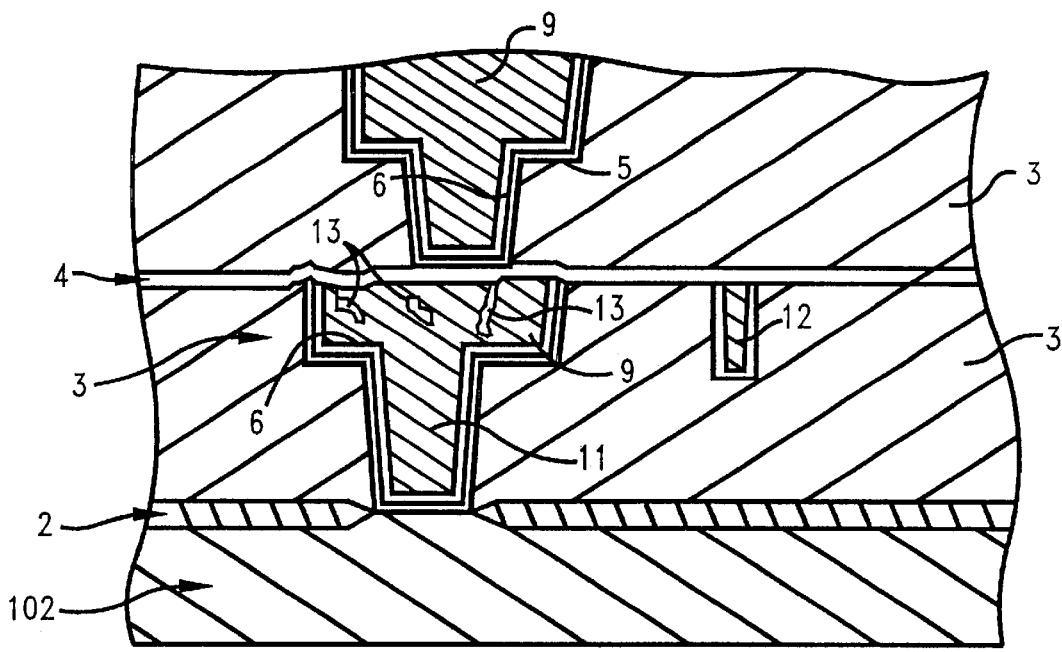
FIG. 1 is an elevational view of a portion of a multilevel copper interconnection of the prior art, made with the dual damascene method using electroplated copper and depicting metal corrosion and line defect caused in a normal process.
Figure 1A:
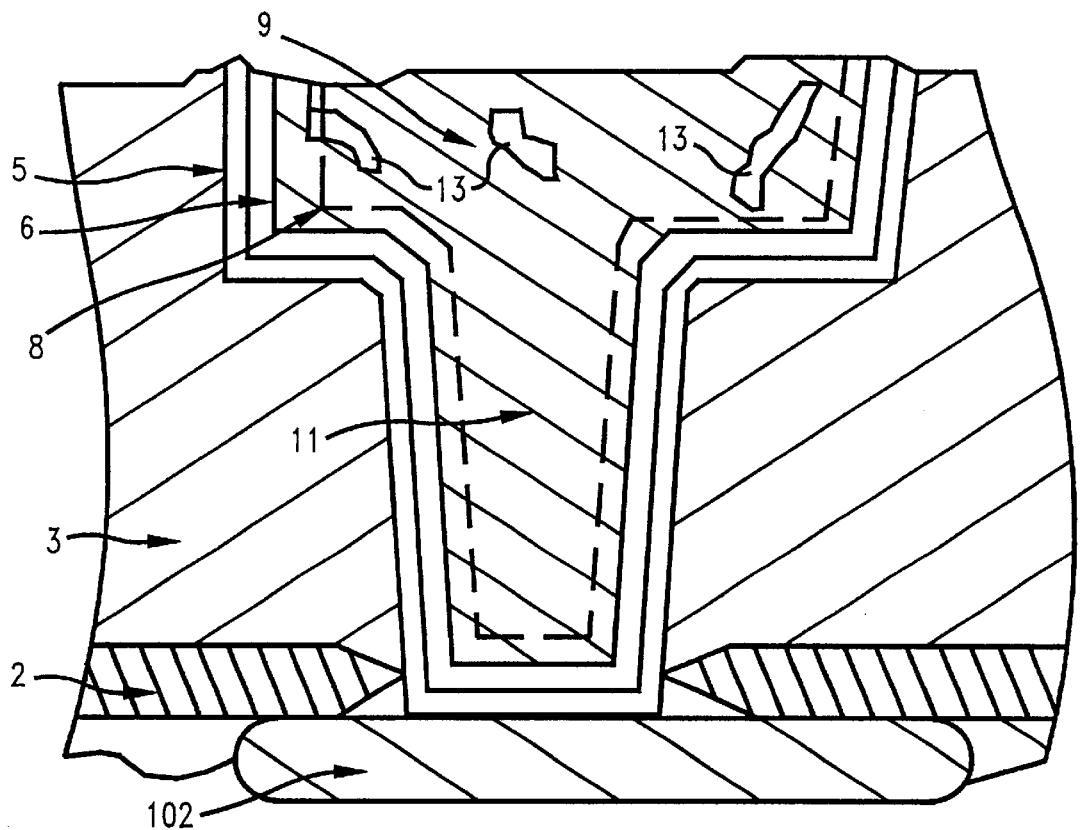
FIG. 1a is an enlarged view of a portion of the interconnection of FIG. 1 showing various metal layers used in the prior art.

In describing the preferred embodiment of the present invention, reference will be made herein to FIGS. 2–8 of the drawings in which like numerals refer to like features of the invention. Features of the invention are not necessarily shown to scale in the drawings.

Figure 2:
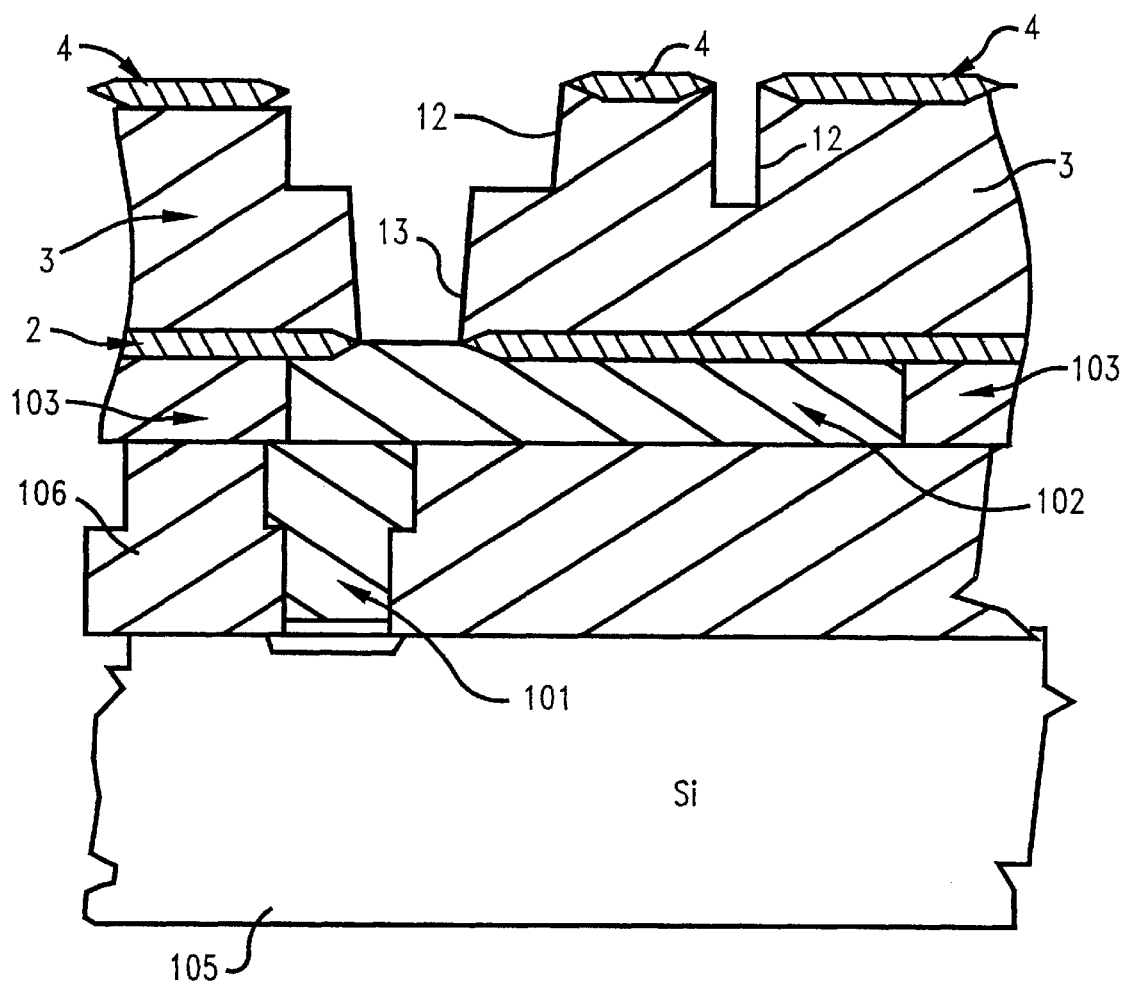
FIG. 2 is an elevational view of a substrate prior to commencing the method of the present invention; wherein a layer of an organic dielectric insulator and a thin layer of another dielectric insulator are deposited and combined patterns of via-studs and interconnection lines are etched, in accordance with the teachings of double damascene methods of prior art, to expose the metal features below.

Referring to FIG. 2, there is shown a cross-section of conventional silicon semiconductor structure comprised of a silicon substrate 105 having thereon various device contact studs (vias) 101 and local interconnects (lines) 102, typically tungsten with underlayers of titanium and titanium nitride (not shown) formed within insulator layers 106, 103, respectively. The use of a thin layer of an insulator to prevent the formation of metal spikes between vias and lines, e.g., due to misalignment, is disclosed in U.S. Pat. No. 6,133,139 entitled "SELF-ALIGNED COMPOSITE INSULATOR WITH SUB-HALF MICRON MULTILEVEL HIGH DENSITY ELECTRICAL INTERCONNECTIONS AND PROCESS THEREOF" filed on even date herewith.

The method of the present invention forms reliable multilevel interconnections of copper lines, at sub-micron pitch, and isolated from one another by low dielectric insulation, making contacts to electrical features in a substrate. The substrate structure may be a semiconductor having a plurality of electronic devices, an organic circuit carrier, or a ceramic circuit carrier. The local interconnects 102 are preferably formed by damascene methods of prior art, with the top surfaces of the local interconnects being substantially planar with the surface of surrounding insulator 103, typically deposited boro-silicate or phospho-silicate glass or $SiO_2$. Dielectric insulator layers 2, 3 and 4 are next deposited to begin a process of forming high conductivity interconnections. The pair of insulators may be deposited by ECR, sputtering, Plasma Enhanced CVD, CVD, spin-coating or any combination of these methods. For example, these insulators may be made of polyimide, silicon-nitride, alumina, silicon-dioxide, phospho-silicate glass, yttrium oxide, magnesium oxide, aero-gel, or any combination of these materials.

The choice of insulators and methods to incorporate them in the fabrication of integrated circuits taught in co-pending U.S. patent application Ser. No. 08/841,221 may be employed here, and the disclosure of this application is incorporated herein by reference.

A via-stud pattern is next defined atop insulator 4, for example, by a photolithographic process, followed by the step of etching insulator 4 and partially etching insulator 3 with suitable etchants. The pattern for the high conductivity metal interconnection lines is next defined, again, for example, by a photolithographic process, followed by etching remainder of insulator 3 and insulator 2 to form trenches 12 and holes 13 to expose metal line 102. These steps are initial process steps of the method known in the art as a double damascene method and described in such publications as U.S. Pat. No. 5,434,451 to Dalal et al., assigned to the assignee of the instant application, the disclosure of which is hereby incorporated by reference.

Next, liner materials and high conductivity metal of choice are deposited in accordance with the present invention, and polished by chemical-mechanical methods to remove excess metals, thereby simultaneously forming the via-stud and interconnection metal line patterns. The present invention is implemented at the point in the process where the combined via-stud and interconnection line patterns are etched in insulator layers 2, 3 and 4 to expose portions of local interconnect 102.

Figure 3:
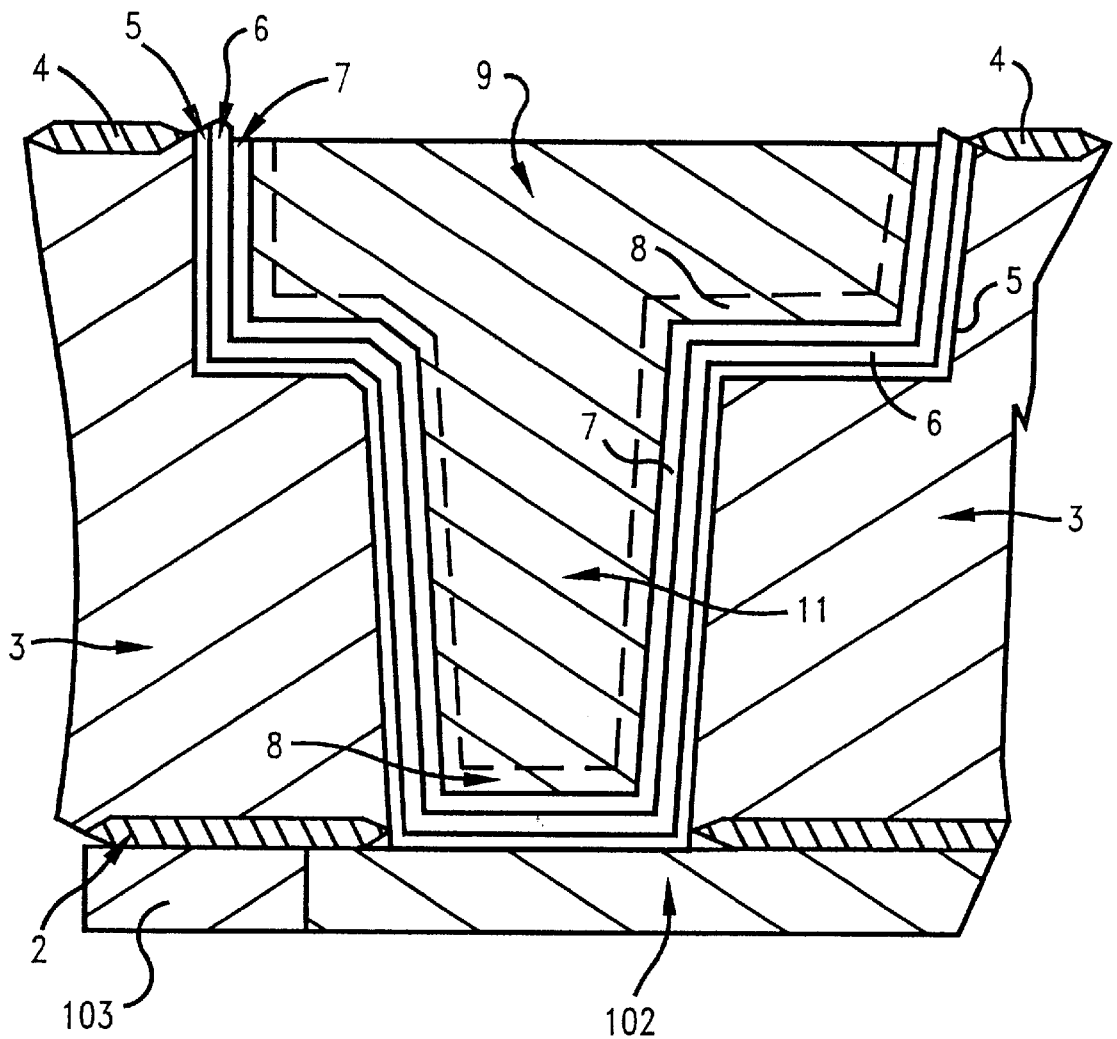
FIG. 3 is an elevational view of various layers in an as-formed interconnection structure incorporating a copper intermetallic-forming composition of the present invention.
Figure 4:
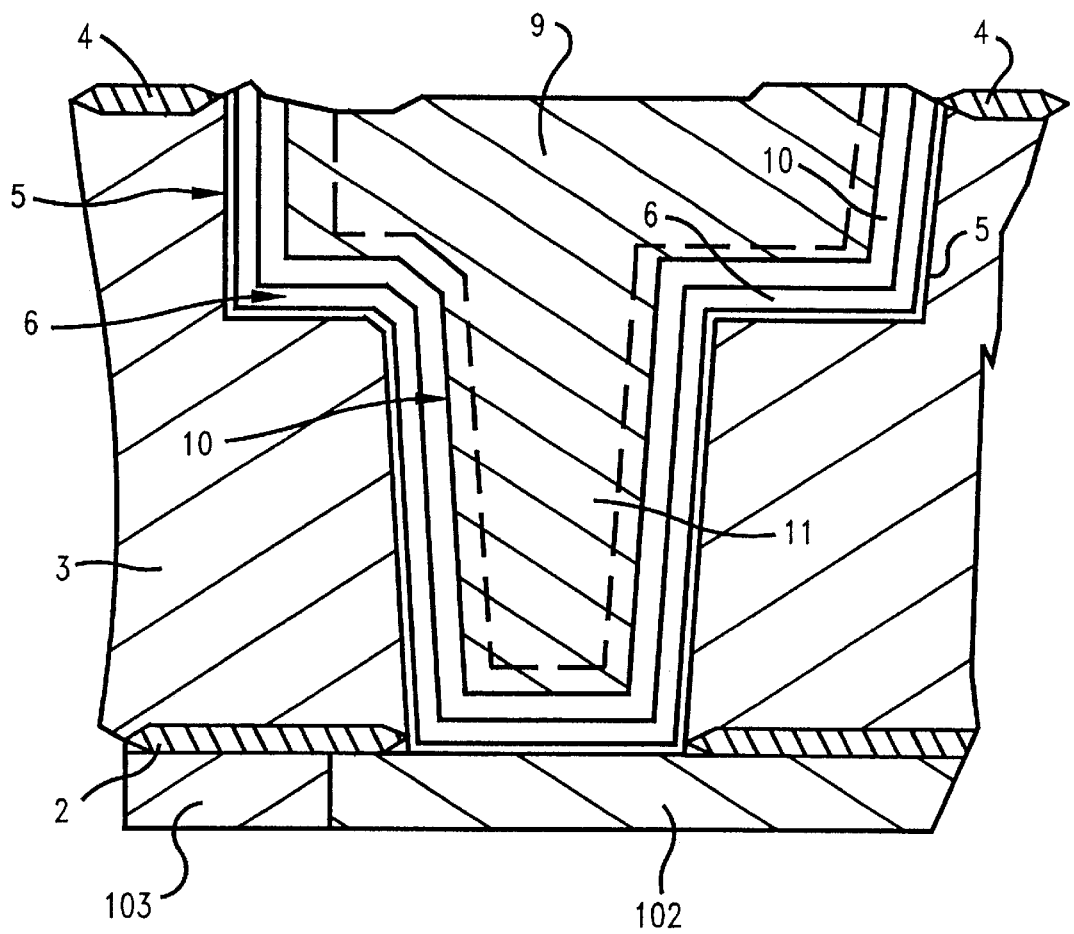
FIG. 4 is an elevational view of the interconnection structure of FIG. 3 after the copper seed layer is converted into an intermetallic underlayer for the interconnection in accordance with the present invention.

The interconnection of present invention is illustrated beginning with FIG. 3 where only a portion of FIG. 2 is shown for clarity. After in-situ sputter cleaning wafers having the structure of FIG. 2, there is deposited a thin layer 5, typically 100 to 300 angstroms thick, of an adhesive and contact metal, preferably titanium, tantalum, tantalum nitride, tantalum, chromium, tungsten, or any combination of these layers. Thereafter there is deposited an optional thermal diffusion barrier layer 6, typically 200 to 400 angstroms thick, of material such as chromium—chromium oxide, tungsten-silicon, tungsten-nitride, tungsten-nitride-silicon, titanium-nitride, tantalum or tantalum-nitride. Layers 5 and 6 are referred to as the liner metallurgy employed in the present invention. The contact metal may be, for example, titanium, tantalum or tantalum-nitride, for example. The barrier material may be titanium-nitride, titanium-oxy-nitride, tantalum, tantalum-nitride, chromium, chromium/chromium-oxide, tungsten, tungsten-nitride, tungsten-silicon, or any combination among them.

The liner layers may be deposited by common or separate deposition techniques such as sputtering or evaporation. Preferably, a sputtering technique is employed such as reactive sputtering, collimated sputtering, magnetron sputtering, low pressure sputtering, ECR sputtering, ionized beam sputtering or any combination of them. More preferably, these aforementioned depositions of layers 5 and 6 are carried out using collimated sputtering in a single pump down and using the technique for depositing reactive metals taught by Dalal and Lowney in U.S. Pat. No. 4,379,832, assigned to the assignee of the instant invention, the disclosure of which is hereby incorporated by reference. The preferred deposition temperature is between about 120° C. and 400° C.

Following this optional layer 6, in a first embodiment of the present invention there is deposited a thin layer 7, preferably from about 100 to 600 angstroms thick, of an element which is capable of forming an intermetallic compound with copper. Such element may be selected from the group consisting of hafnium, lanthanum, zirconium, tin and titanium. Thereafter, there is deposited a thin copper seed layer 8, typically 600 to 2000 angstroms thick.

Layers 5–8 may be deposited by common or separate deposition techniques such as sputtering, evaporation or CVD. Preferably, a sputtering technique is employed such as reactive sputtering, collimated sputtering, magnetron sputtering, low pressure sputtering, ECR sputtering, ionized beam sputtering or any combination of them. More preferably, these aforementioned depositions of layers 5, 6, and 7 and 8 are carried out using collimated sputtering in a single pump down and employing the technique for depositing reactive metals taught by Dalal and Lowney in U.S. Pat. No. 4,379,832, assigned to the assignee of the instant invention, the disclosure of which is hereby incorporated by reference. The preferred deposition temperature is between 120°–400° C. The copper seed layer may also intentionally contain carbon in interstitial positions, for enhanced electromigration resistance, and will be discussed further below.

Following the copper seed layer 8, a remaining layer 9 of copper is then electroplated to fill the trenches. Alternatively, layer 8 or 8 and 9 may be deposited by CVD methods. The substrate wafers are then polished by chemical-mechanical methods to remove all excess metals from unpatterned areas, thereby, resulting the planarized structure shown in FIG. 3.

If intermetallic forming metal layer 7 is used, the substrate wafers are next heated in a non-reactive atmosphere such as nitrogen to a temperature of about 250°–450° C. for 30 min. to 2 hours. This causes the intermetallic forming layer 7 to react with the copper layers to form a layer of copper intermetallic compound, 10 in FIG. 4. The copper intermetallic layer provides an improved electromigration resistance to the copper layers 8 and 9. The thickness of the intermetallic forming metal is preferably selected so as to consume all of the copper seed layer 8 (FIG. 3) during formation of the intermetallic compound. The intermetallic compounds formed in the copper layer by the present invention may be hafnium cupride ($Hf_2Cu$), lanthanum cupride ($LaCu_2$), etabronze ($Cu_6Sn_5$), titanium cupride (TiCu) and zirconium cupride ($Zr_2Cu$).

The intermetallic layer may be a complete intermetallic or a combination of intermetallic and constituent metal layers. The choice of intermetallic forming element may be based on two criteria. First, the chosen element preferably has no, or less than 2 atomic percent, solubility in copper. Low solubility is important as otherwise the element will diffuse into copper and affect its electrical conductivity. Second, the element preferably forms a stable intermetallic with copper. In addition to the above mentioned elements, any other elements which meet these criteria may be employed as the copper intermetallic-forming element.

The above process steps are repeated for definition and formation of interconnections on higher levels. It should be understood that one may choose to perform only one heat treatment, after the final level of interconnection is defined, to form the intermetallic; or, one may choose to repeat the heat treatment after each level of interconnection.

Figure 5A:
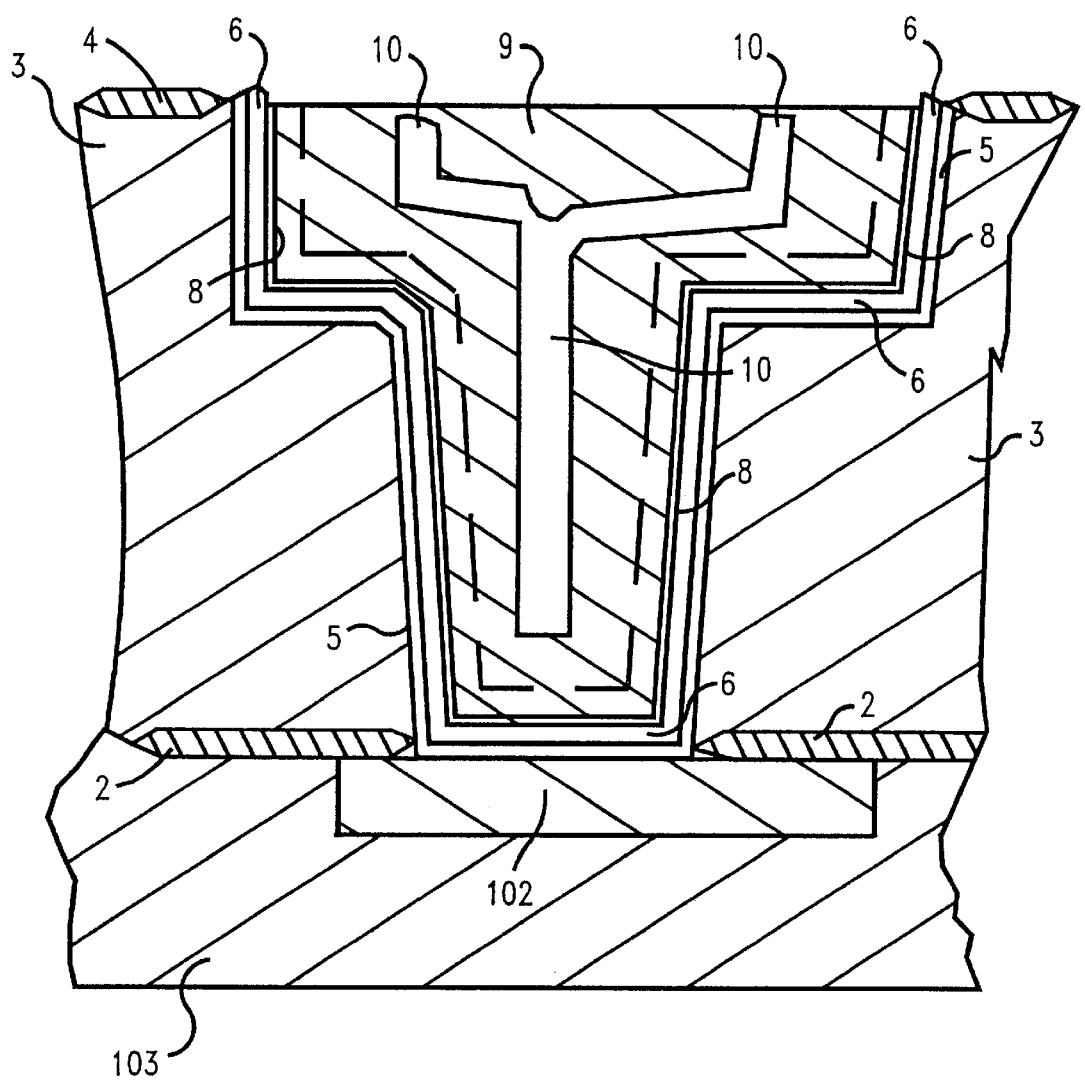
Figure 5B:
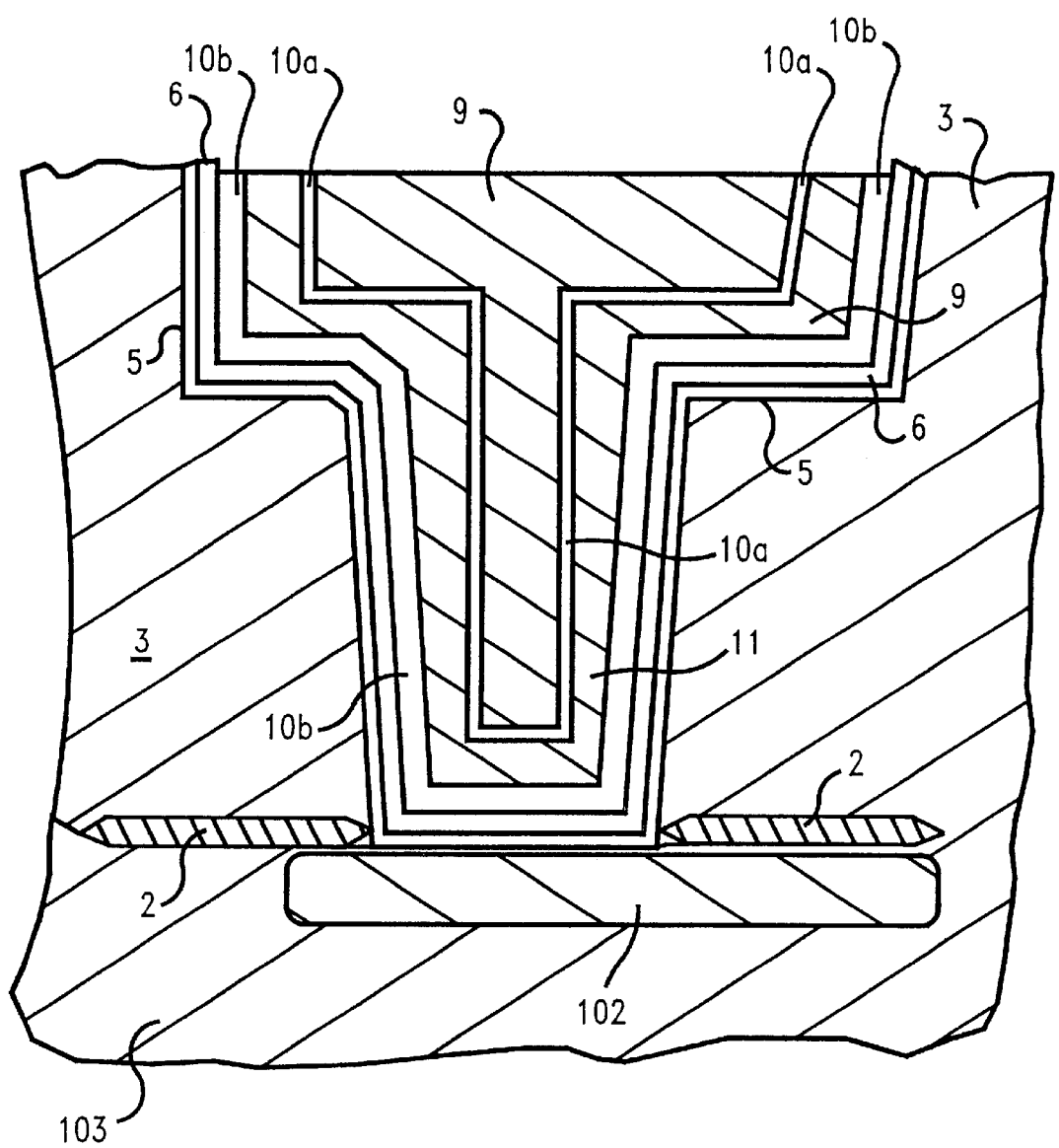

In another embodiment of the present invention, the intermetallic layer is formed at the middle of the interconnection thickness, as shown in FIG. 5*a* for small dimension via studs, and in FIG. 5*b* for a wider via-stud. In this embodiment, intermetallic layer 7 is deposited after an initial layer of copper so as to form the intermetallic compound region away from the edges of the copper and toward the interior region. FIG. 5*a* shows the intermetallic region 10 after heat treatment (where the intermetallic element layer 7 was initially deposited) in a Y-shape in the interior of the copper layer 9. Also, more than one intermetallic region may be employed, as shown in FIG. 5*b* where two regions of intermetallic element 7 were deposited in the location where intermetallic compound regions 10*a* and 10*b* are shown, after heat treatment.

Figure 6A:
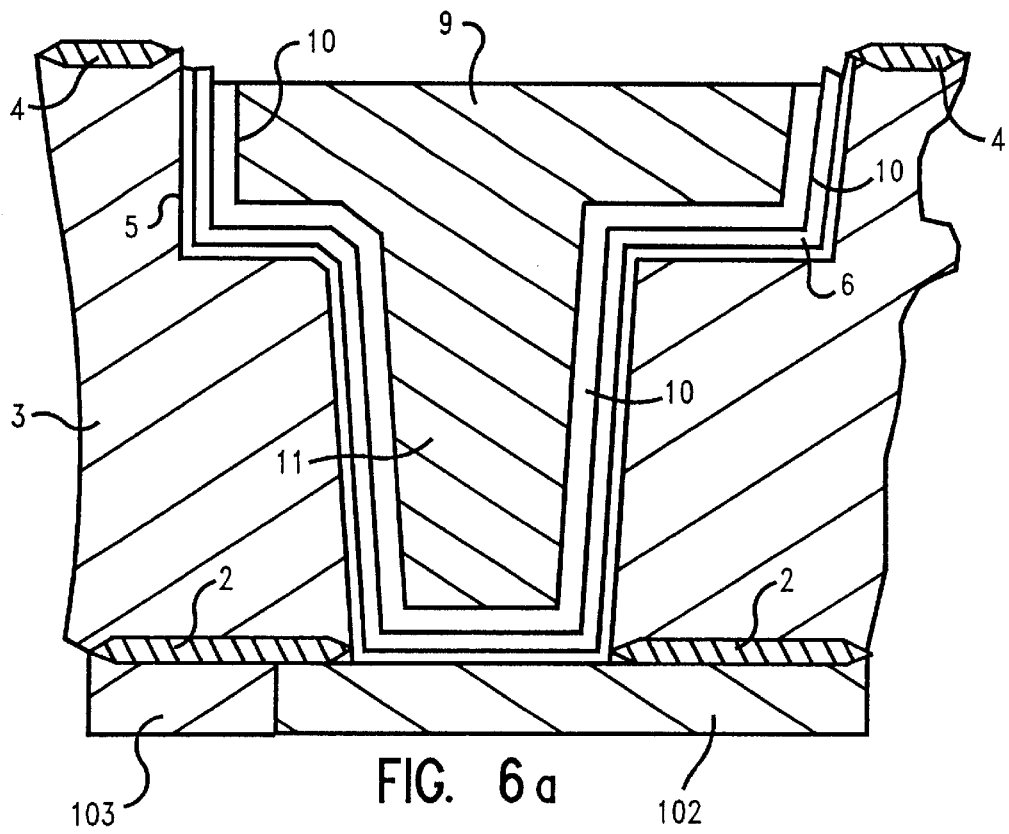
FIGS. 6a, 6b, 6c, and 6d are elevational views of the structure formed as shown in FIG. 3, but with a thin layer of copper removed from the top surface to show the sequence of processing steps to form a cap layer in accordance with the present invention.

In still another embodiment of the present invention, the intermetallic forming element is deposited on the top of the copper lines in the form of a cap. As shown in FIG. 6*a*, after forming the planarized structure of FIG. 3, a thin layer of copper, approximately 100 to 400 angstroms thick, is removed to recess its surface from the surrounding insulation surface. Removal may be by light chemical-mechanical polishing, mechanical polishing, or both, of the copper interconnect lines or via-studs to provide a planarized cap surface.

Figure 6B:
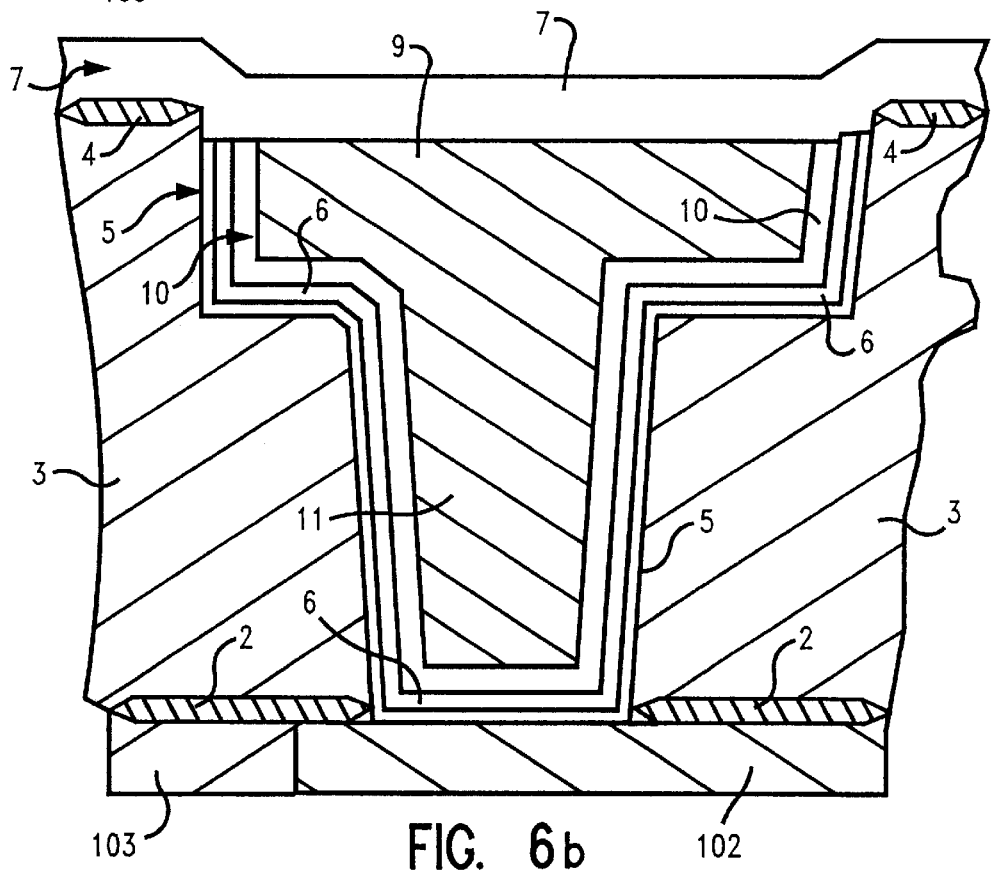
Figure 6C:
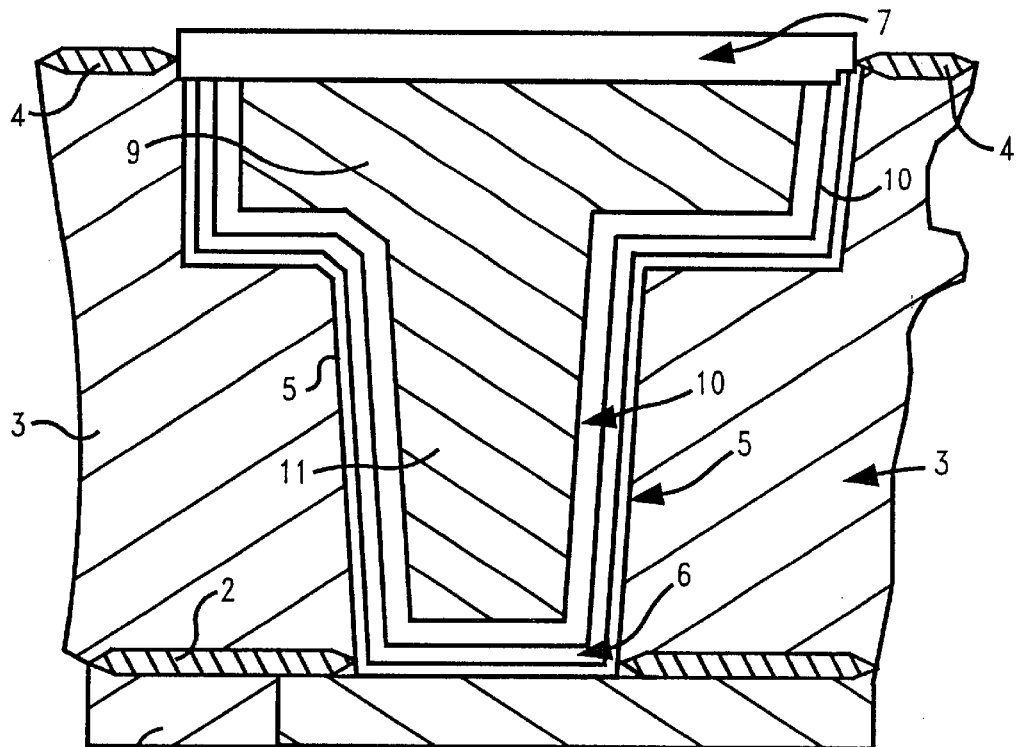
Figure 6D:
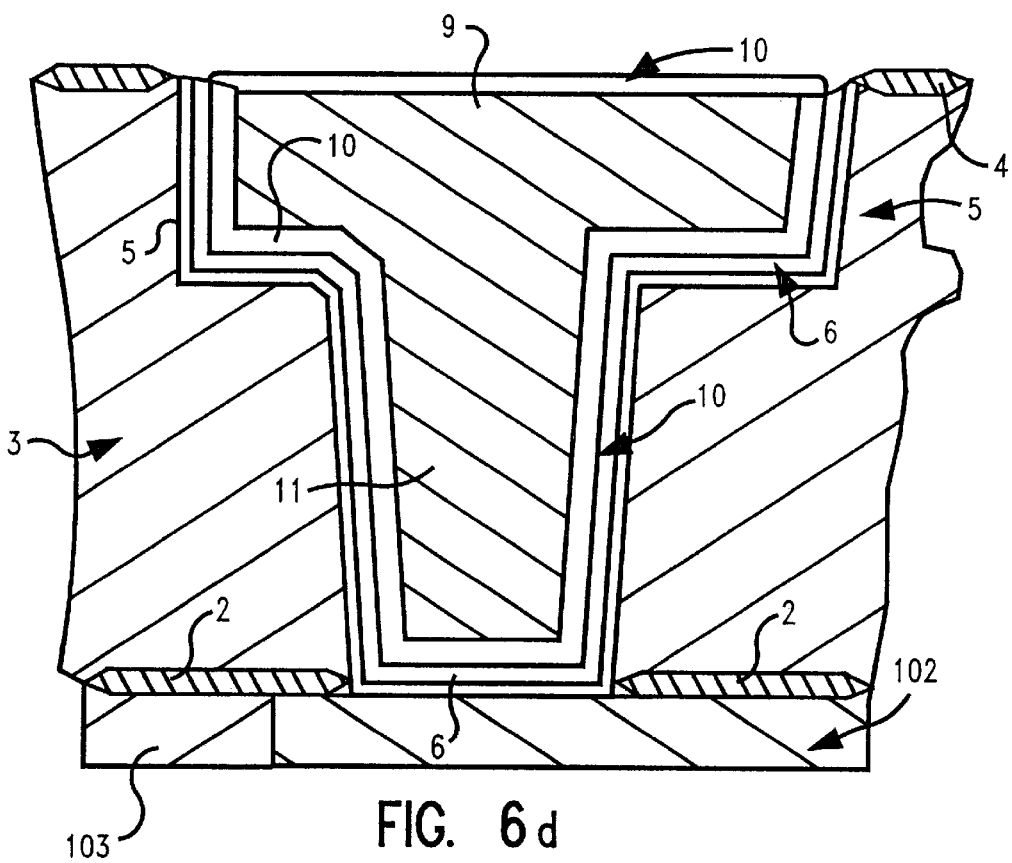

As shown in FIG. 6*b*, a thin layer of an intermetallic forming element is next selectively deposited by the aforementioned methods (PVD, electroplating, electroless plating, CVD, or by any combination of them) preferably after in-situ sputter cleaning of the wafer. Excess metal from outside the interconnect trench is then removed by chemical-mechanical polishing, or simply mechanical polishing, leaving the cap of intermetallic forming element atop copper lines at the same level as the surface of layer 4, as shown in FIG. 6*c*. The next step is to heat treat the wafers, as described above, to form intermetallic layer 7 at the top of the copper layer 9. In FIG. 6*d* there is shown the embodiment where the intermetallic layer or region is formed both at the bottom and at the top of the copper interconnection layer.

This method of forming an intermetallic cap layer has an advantage of fully covering the copper lines along the line edges, as opposed to leaving narrow slits of copper exposed, as in methods where cap metal is deposited along with the liner and copper. It should be understood that, whereas this method of forming a cap is described here with the objective of forming a cap of an intermetallic compound, the method is not limited to such metals, but any desired metal, alloy or intermetallic compound may be used, such as tungsten, tungsten-silicon, tungsten-nitrogen, hafnium, zirconium, tantalum, tantalum-nitride, titanium, tin, lanthanum, germanium, carbon, chromium, chromium-chromium oxide, tin, platinum, or any combination among them.

As such, the copper intermetallic layer is formed by selective deposition either at the bottom, in the middle, at the top of the copper line cross-section, or at any combination of these sites. The present invention provides a method to form in-situ a copper intermetallic layer at any or all of these regions to improve the electromigration resistance of copper interconnection lines.

In order to incorporate carbon atoms within the deposited copper lattice, as discussed above the copper seed layer is preferably deposited in a vacuum tool along with intentional bleeding of a carbonaceous material, in gaseous form. The substrate is preferably held at a temperature from about 100–400° C. The carbonaceous material is a hydrocarbon that does not contain oxygen, nitrogen or sulphur, such as those carbonaceous materials belonging to the $C_xH_y$ or $C_xH_x$ hydrocarbon groups. The carbonaceous material may be introduced into the vacuum tool in concentrated form, or in a diluted form using an inert carrier gas. Preferably, the vacuum tool is a sputtering or an evaporation tool, and the partial pressure of the carbonaceous material is from about $10^{-4}$ to $10^{-7}$ Torr.

More preferred parameters of such deposition process are initially pumping down the substrate to a pressure of $10^{-8}$ Torr, bleeding in acetylene gas at a pressure of $10^{-5}$ Torr using an automatic pressure control, and subsequently introducing argon gas at a pressure of 4 milli. Torr and sputter depositing the copper into the trenches of the substrate. This aspect of the present invention provides an interconnection of copper having 0.1 ppm to 15 ppm dissolved carbon in the copper lattice.

Incorporation of such carbon in the copper has been found to enhance electromigration resistance in electroplated copper, and to a lesser degree, in CVD copper. While not wishing to be bound by theory, it is believed that the enhanced electromigration resistance is due to incorporation of carbon atoms at interstitial positions. Such interstitial carbon does not appreciably affect the copper's electrical properties but greatly influence its chemical and mechanical properties.

It should be apparent that given the guidance and the illustrations set forth herein, alternate embodiments of the processes and structures of the present invention may be suggested to a skilled artisan. For example, it should be understood that the copper seed layer 8 is deposited for the purpose of electroplating copper in the next process step. If a choice is made to use CVD copper for layer 9, seed layer 8 is not needed. Also, the pair of insulators could be organic/inorganic, organic/organic or inorganic/inorganic.

It has also been found that in forming copper interconnections by damascene methods, the use of chemical vapor deposition to deposit the copper seed layer provides heretofore unknown advantages as compared to use of physical vapor deposition (e.g., sputtering or evaporation) techniques at the typical 1100–2000 angstrom thicknesses employed in the prior art. The CVD copper seed layer deposited may have a thickness range of about 50–2000 angstroms, preferably in the range of about 100–700 angstroms. Alternatively, a PVD copper seed layer, when deposited at a thickness less than about 800 angstroms, preferably below about 600 angstroms, provides advantages over thicker prior art PVD copper seed layers. These advantages include higher electromigration resistance. When using the CVD copper seed layer or when using the PVD copper seed layer below 800 angstroms thickness, the copper layer which fills the trench may be deposited directly on the copper seed layer without the copper intermetallic layer in accordance with the present invention. Copper layer should be deposited by a process different than that used to deposit the seed layer.

Figure 7:
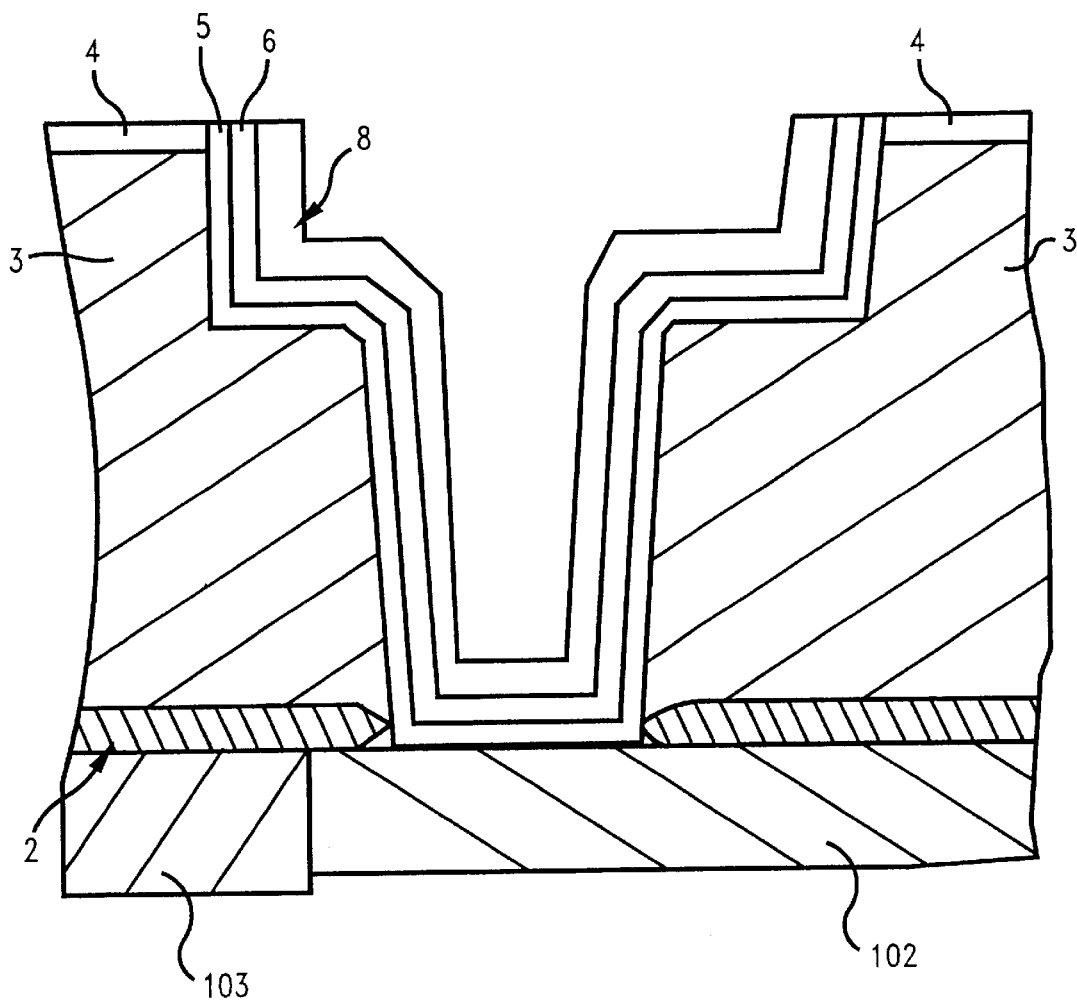
FIG. 7 is an elevational view of various layers in an as-formed interconnection structure made with the use of a PVD or CVD copper seed layer in accordance with the present invention.
Figure 8:
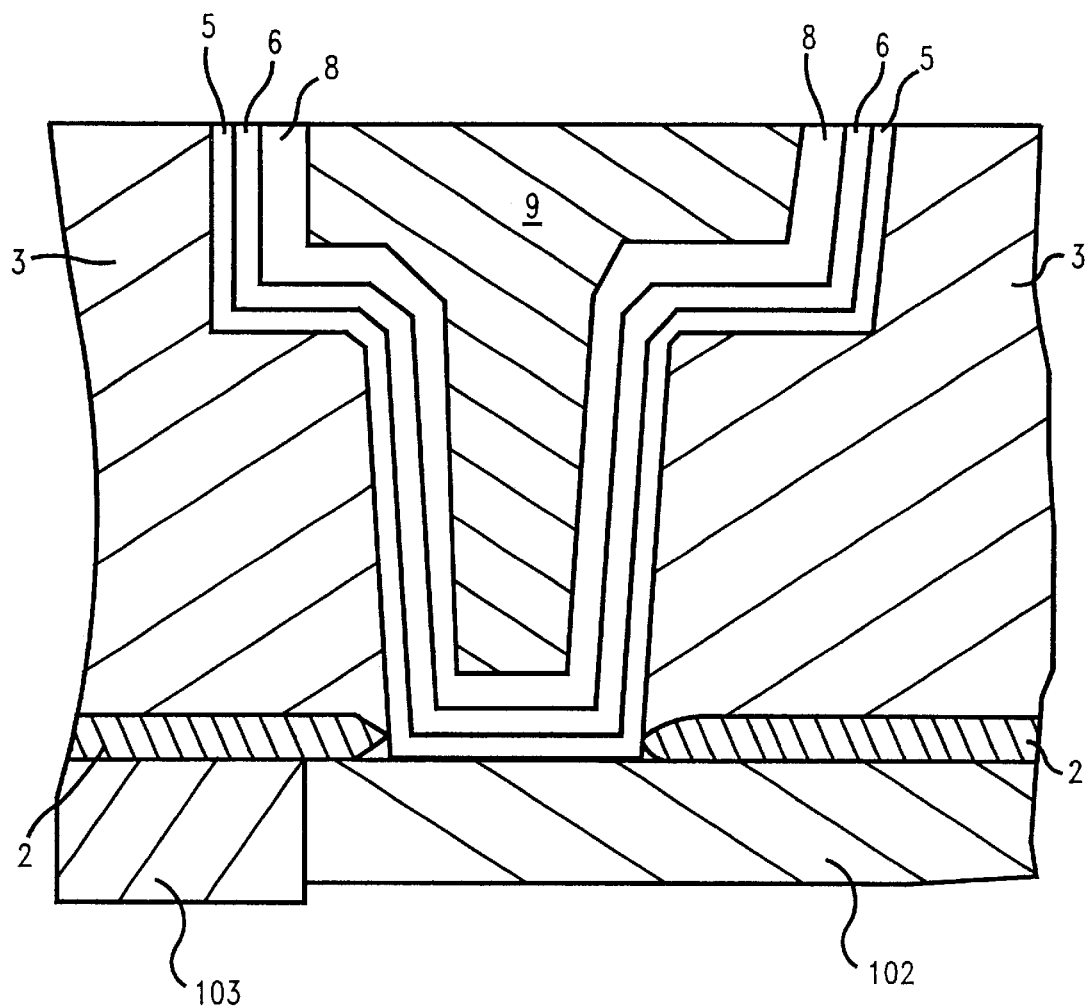
FIG. 8 is an elevational view of the structure of FIG. 7 after an electroplated layer of copper has been deposited over the seed layer and the wafer has been polished to remove excess metal.

The interconnection of this aspect of the present invention is shown in FIGS. 7 and 8. As shown in FIG. 7 (which shows a portion of FIG. 2), after in-situ sputter cleaning wafers with the structure of FIG. 2, liner layers 5 and 6 are deposited in the same manner as previously described, with thermal diffusion layer 6 still being optional. However, instead of depositing copper intermetallic layer 7, seed layer 8 may be deposited directly on liner layer 6, or if layer 6 is not present, directly on liner layer 5. If a CVD technique is employed, the seed layer thickness 8 is more preferably in the range of about 300 to 600 angstroms. If a PVD technique is employed, the copper seed layer is preferably less than about 600 angstroms, thick, more preferably about 200 to 500 angstroms thick. Following copper seed layer 8, a remaining layer 9 of copper is electroplated to completely fill the trenches. The substrate wafers are then polished by chemical-mechanical methods to remove all excess metal from unpatterned areas, thereby resulting in the structure shown in FIG. 8. Such a structure may then provide sub-quarter-micron copper interconnections with improved electromigration resistance and reduced defect sensitivity.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for forming multilevel interconnections of copper lines isolated from one another by dielectric insulation for making contacts to electrical features in a substrate, the method comprising the steps of:
    (a) preparing a substrate having a dielectric insulation layer to receive copper lines in a defined pattern;
    (b) optionally depositing a metallic liner in said pattern;
    (c) depositing in said pattern a layer of an element capable of forming an intermetallic compound with copper, wherein said element has less than two atomic percent solubility copper, and wherein the intermetallic forming element is selected from the group consisting of hafnium, lanthanum, tin and zirconium;
    (d) subsequently depositing in said pattern a chemical vapor deposition layer of copper; and
    (e) depositing over the chemical vapor deposition copper layer by a different process a layer of copper to substantially fill said pattern; and
    (f) heating the substrate to react the intermetallic forming element with said layer of copper which substantially fills said pattern to form a layer of intermetallic compound.

2. The method of claim 1 wherein the chemical vapor deposition copper layer has a thickness of about 50 to 2000 angstroms.

3. The method of claim 1 wherein the chemical vapor deposition copper layer has a thickness of about 100 to 700 angstroms.

4. A method for forming multilevel interconnections of copper lines isolated from one another by dielectric insulation for making contacts to electrical features in a substrate, the method comprising the steps of:
    (a) preparing a substrate having a dielectric insulation layer to receive copper lines in a defined pattern;
    (b) optionally depositing a metallic liner in said pattern;
    (c) depositing in said pattern a layer of an element capable of forming an intermetallic compound with copper, wherein said element has less than two atomic percent solubility copper, and wherein the intermetallic forming element is selected from the group consisting of hafnium, lanthanum, tin and zirconium;
    (d) subsequently depositing in said pattern a physical vapor deposition layer of copper having a thickness of less than about 800 angstroms; and
    (e) depositing over the physical vapor deposition copper layer by a different process a layer of copper to substantially fill said pattern; and
    (f) heating the substrate to react the intermetallic forming element with said layer of copper which substantially fills said pattern to form a layer of intermetallic compound.

5. The method of claim 4 wherein the physical vapor deposition is by copper sputtering.

6. The method of claim 4 wherein the physical vapor deposition is by copper evaporation.

7. The method of claim 4 wherein the physical vapor deposition copper layer has a thickness below about 600 angstroms.

8. A method for forming multilevel interconnections of copper lines isolated from one another by dielectric insulation for making contacts to electrical features in a substrate, the method comprising the steps of:
    (a) preparing a substrate having a dielectric insulation layer to receive copper lines in a defined pattern;
    (b) optionally depositing a metallic liner in said pattern;
    (c) depositing in said pattern a layer of an element capable of forming an intermetallic compound with copper, wherein said element has less than two atomic percent solubility copper, and wherein the intermetallic forming element is selected from the group consisting of hafnium, lanthanum, tin and zirconium;
    (d) subsequently depositing in said pattern a seed layer of copper by chemical vapor deposition, wherein said seed layer has a thickness less than about 800 angstroms;
    (e) depositing over the copper seed layer by a different process a layer of copper to substantially fill said pattern; and
    (f) heating the substrate to react the intermetallic forming element with said layer of copper which substantially fills said pattern to form a layer of intermetallic compound.

9. The method of claim 8 wherein the copper seed layer has a thickness less than about 600 angstroms.

* * * * *